United States Patent [19]

Fujizaki et al.

[11] Patent Number: 4,954,088
[45] Date of Patent: Sep. 4, 1990

[54] SOCKET FOR MOUNTING AN IC CHIP PACKAGE ON A PRINTED CIRCUIT BOARD

[75] Inventors: Tsutomu Fujizaki, Yokohama; Minoru Shibata, Matsuzaka, both of Japan

[73] Assignee: Matsushita Electric Works, Ltd., Japan

[21] Appl. No.: 480,908

[22] Filed: Feb. 16, 1990

[30] Foreign Application Priority Data

Feb. 23, 1989 [JP] Japan .................................. 1-44611
Sep. 26, 1989 [JP] Japan ............................ 1-112424[U]

[51] Int. Cl.$^5$ .......................................... H01R 9/09
[52] U.S. Cl. ...................................... 439/73; 439/81; 439/83; 439/828
[58] Field of Search ................. 439/72, 73, 78, 81, 439/83, 826, 828

[56] References Cited

U.S. PATENT DOCUMENTS

| | | | |
|---|---|---|---|
| 4,110,917 | 9/1978 | Le Grelle | 439/83 |
| 4,252,390 | 2/1981 | Bowling | 439/73 |
| 4,417,777 | 11/1983 | Bamford | 339/17 CF |
| 4,422,128 | 12/1983 | Zurlinden et al. | 439/83 |
| 4,491,377 | 1/1985 | Pfaff | 339/17 CF |
| 4,555,153 | 11/1985 | Bricaud et al. | 439/81 |
| 4,682,829 | 7/1987 | Kunkle et al. | 439/83 |
| 4,758,176 | 7/1988 | Abe et al. | 439/73 |
| 4,824,392 | 4/1989 | Billman et al. | 439/73 |

Primary Examiner—Paula A. Bradley
Attorney, Agent, or Firm—Stevens, Davis, Miller & Mosher

[57] ABSTRACT

A socket for mounting IC chip package on a printed circuit board has an elongated socket body having a plurality of contact elements aligned along the length of the socket body for contact with corresponding one of leads extending laterally from the IC chip package. A cover frame is fitted over the socket body to press the IC chip leads against the corresponding contact elements for positive electrical connection therebetween. The socket body carries between the longitudinal ends thereof the contact elements and is engaged at the longitudinal ends with the cover frame. Each contact element is struck from a metal strip to include a base and an anchor leg extending from one end of the base to be bent into the socket body, the other end of the base extending laterally and being bifurcated to form a vertically spaced pair of a spring leg for contact with the corresponding one of the IC chip leads and a terminal leg for connection with a circuit on the printed board. The socket body formed in its laterally central portion with a plurality of slots which opens to a bottom surface of the socket body and into which the anchor leg is press-fitted such that the spring leg and the terminal leg project laterally outwardly of the socket body to leave therebetween an open space available for soldering the terminal legs on the printed circuit board.

9 Claims, 5 Drawing Sheets

SOCKET FOR MOUNTING AN IC CHIP PACKAGE ON A PRINTED CIRCUIT BOARD

BACKGROUND OF THE INVENTION

1. Field of the Invention

The present invention is directed to a socket for mounting an IC chip package on a printed circuit board, and more particularly to such a socket fitted with a cover frame for pressing IC chip leads against corresponding contact elements of the socket.

2. Description of the Prior Art

For mounting on a printed circuit board an IC chip package having a row or rows of leads extending laterally from the package, a socket is generally utilized to have a corresponding number of electrical contact elements each connected at its end to the corresponding one of the IC package leads and at the other end with a corresponding pad of the circuit on the surface of printed board. In known sockets designed for the above IC chip package, for example, SIP (single-in-line package) or DIP (dual-in-line package) and including a cover frame for pressing IC package leads against the corresponding contact elements, the contact elements are carried on an elongated socket body to be aligned along the length thereof with its one end positioned upward for contact with the leads and with the other end positioned downward for connection with the circuit of the printed board. For coupling with the cover frame, the socket body of the prior socket is configured to include catch members on its top laterally outwardly of the upper end of the contact elements, i.e. outwardly of the IC package leads, thus adding an extra width dimension to the socket. Further, the contact elements utilized in the prior socket are each in the form of a generally U-shaped configuration inserted or embedded in the socket body with its bent portion positioned laterally inwardly of the socket body so as to project one arm of the U-shape on the upper surface of the socket body to define itself a spring leg for contact with the IC package lead and to project the other arm on the bottom of the socket body to define a terminal leg for connection with the printed board. Due to the requirement that the terminal legs be readily accessible from upward for soldering on the printed board, the terminal legs must project laterally outwardly of the socket body, i.e., beyond the catch member formed at the lateral end of the socket body, which is also responsible for unduly increasing width dimension of the socket. Therefore, the prior socket fitted with the cover frame is found unsatisfactory for providing a compact arrangement particularly with respect to the width dimension.

SUMMARY OF THE INVENTION

The above problem has been eliminated in the present invention which provides an improved socket for mounting an IC chip package on a printed circuit board. The socket of the present invention has an elongated socket body having a plurality of contact elements aligned along the length thereof for contact with corresponding ones of leads extending laterally from the IC chip package. A cover frame is fitted over the socket body to press the IC chip leads against the corresponding contact elements for positive electrical connection therebetween. The socket body carries between the longitudinal ends thereof the contact elements and is formed at the longitudinal ends respectively with catches for fixing the cover frame on the socket body. Each contact element comprises a base and an anchor leg extending from one end of the base into the socket body, the other end of the base extending laterally and being bifurcated to form a vertically spaced pair of a spring leg for contact with the corresponding one of the IC chip leads and a terminal leg for connection with a circuit on the printed board. The contact elements are supported to the socket body with the anchor leg secured to the lateral center portion of the socket body so as to project the spring leg and terminal legs laterally outwardly of the socket body and to form between the spring and terminal legs an open space available for soldering the terminal legs on the surface of the printed board. Thus, the socket body can be designed to have no part or portion projecting laterally outwardly of the spring legs for coupling with the cover frame, the terminal legs can be positioned well within the lateral extremity of the spring legs while leaving the open space between the vertically spaced spring and terminal legs for assuring easy soldering of the terminal legs on the printed board, and the cover frame can be designed to have a lateral member only positioned above the IC package leads, i.e., the spring leg and not required to extend laterally further therebeyond, all of which contribute to reduce the width dimension of the socket.

It is therefore a primary object of the present invention to provide an improved socket for IC chip package which is capable of reducing the width dimension to a minimum advantageous for close mounting of the package on the printed board.

In a preferred embodiment, the socket body includes at its longitudinal ends laterally extending flanges which support corresponding end portions of the cover frame and which have the catches for coupling the cover frame in a position to press the IC package leads against the spring legs. The contact elements are formed on the socket body between the opposed flanges to project the spring and terminal legs into a recess confined between the longitudinally opposed flanges such that these legs do not project laterally beyond the lateral end of the flanges. The cover frame is dimensioned to have the width dimension substantially equal to the lateral dimension of the flanges as it is not required to be coupled to the socket body at a portion laterally outwardly of the spring legs. Thus, the cover frame width can be reduced to a minimum so as to reduce the width dimension of the entire socket assembly, which is therefore another object of the present invention.

The contact elements are preferred to have the anchor legs bent upwardly for insertion into corresponding slots formed in the socket body. The slots are open to the bottom surface of the socket body so that the contact elements can be secured by press-fitting the anchor legs from below. Since the anchor leg is formed at one end of the base opposite from the spring leg, the spring leg can be kept substantially from deformative stress which the anchor leg may encounter when being inserted into the slots. Whereby the spring leg can be prevented from any substantial warping or deflection, and therefore be assured of consistent spring characteristic as desired for reliable electrical connection with the IC package leads.

It is therefore a further object of the present invention to provide an improved socket for IC chip package which is capable of effecting an easy assembly of the contact elements to the socket body, yet assuring reliable spring characteristic for the spring legs.

The spring legs and the terminal legs are preferred to be staggered in the lengthwise direction of the socket body so that the terminal legs can be exposed, without being interfered by the spring legs, to an infrared radiation which may be employed in reflow soldering the terminal legs on the printed board.

It is therefore a still further object of the present invention to provide an improved socket for IC package in which the spring leg and the terminal legs are staggered along the length of the socket body for facilitating reflow soldering of the terminal legs on the printed board by directing an infrared radiation to the terminal legs.

These and still other objects and advantages will become more apparent from the following description of the preferred embodiments when taken in conjunction with the attached drawings.

DESCRIPTION OF THE PREFERRED EMBODIMENTS

First embodiment <FIGS. 1 to 7>

Figure 1:
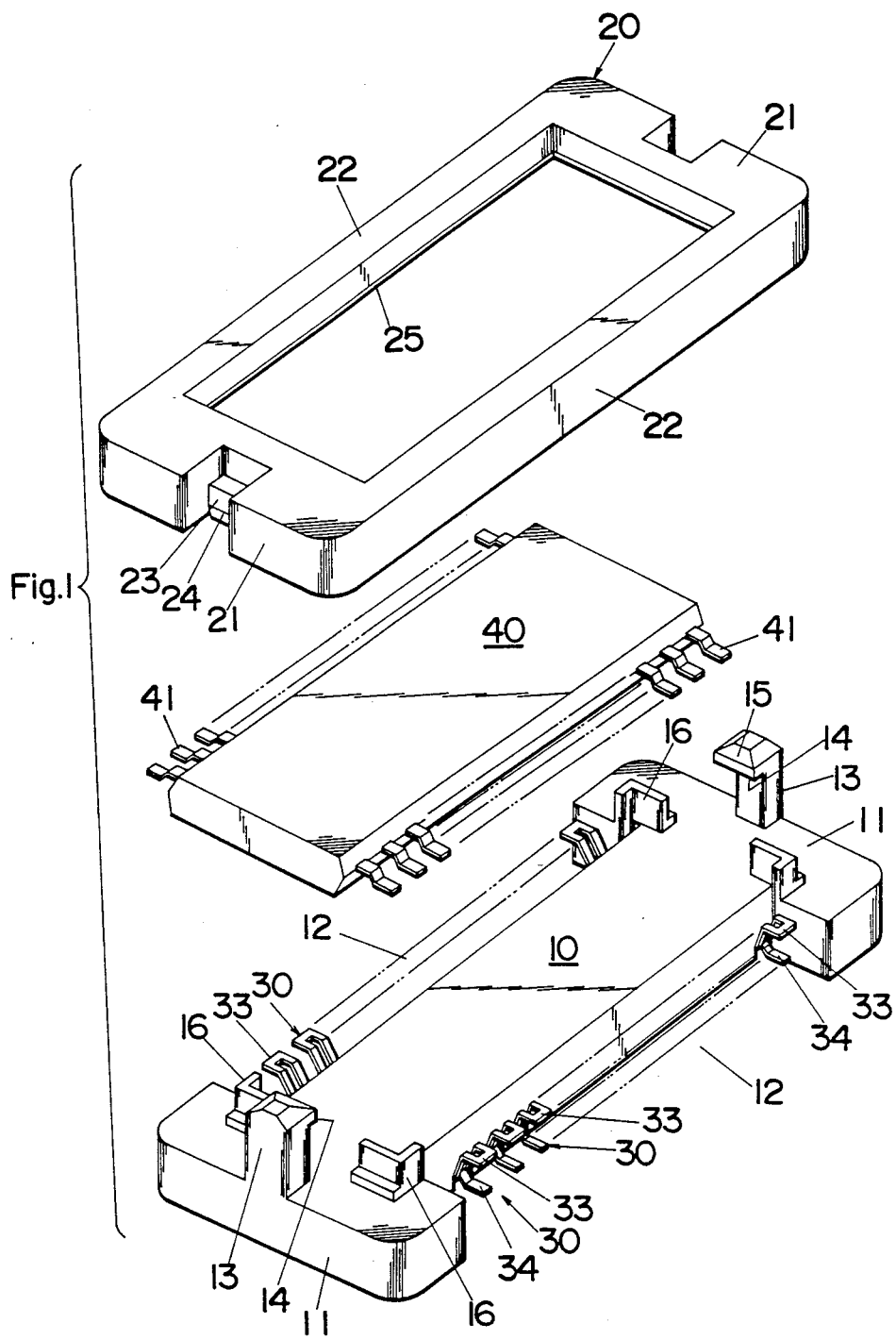
FIG. 1 an exploded perspective view of a socket for IC chip package.
Figure 2:
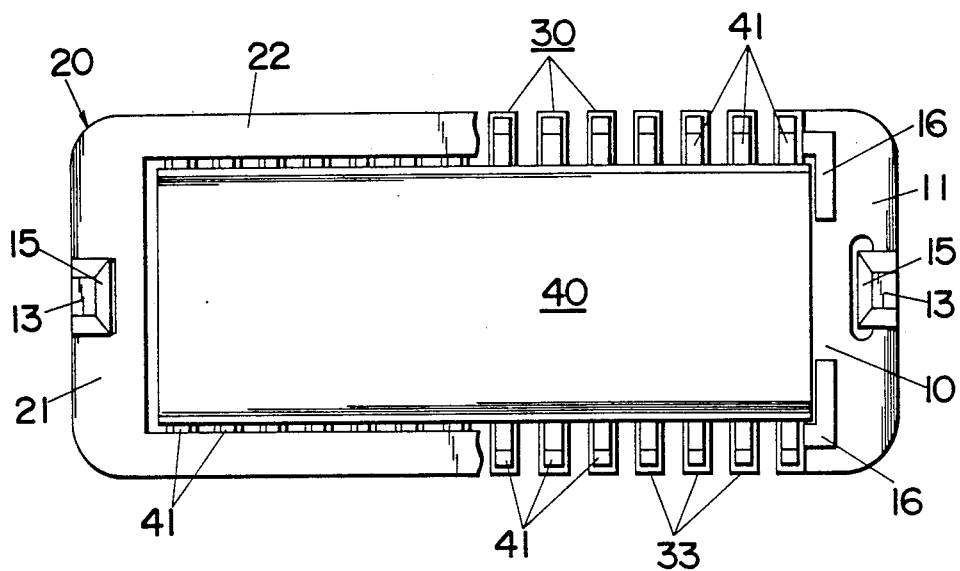
FIG. 2 is a top view of the above socket with a cover frame shown as being removed in the right half of the figure.
Figure 3:
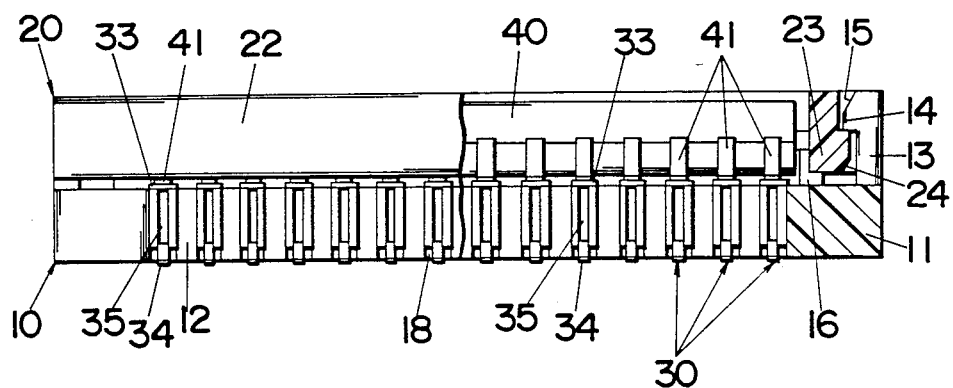
FIG. 3 is a side view partly in section of the above socket.
Figure 4:
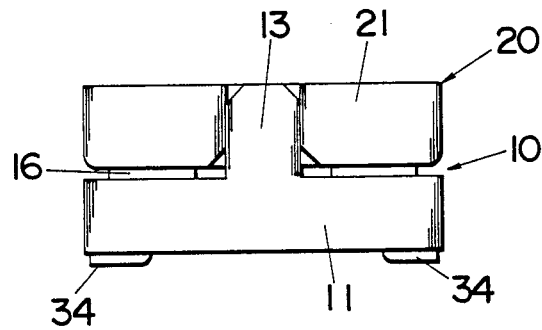
FIG. 4 is an end view of the above socket.

Referring now to FIG. 1, there is shown a socket for mounting an IC chip package on a printed circuit board in accordance with a first preferred embodiment of the present invention. The socket comprises a socket body 10 of electrically insulative plastic material carrying a plurality of contact elements 30 and a coVer frame 20 also of like insulative material fitted over the socket body 10 to hold an IC chip package 40 therebetween. In the illustrated embodiment, the IC chip package 40 is shown as a DIP (dual-in-line package) have a plurality of leads 41 extending laterally therefrom to provide two parallel rows of the leads 41 at the opposite sides of the package. The socket body 10 is an elongated member provided at its longitudinal ends respectively with laterally extending flanges 11 to present a generally I-shaped configuration. The longitudinally spaced flanges 11 determine the width dimension of the socket body 10 and define therebetween recesses 12 laterally outwardly of the socket body 10. The contacts elements 30 are supported on the socket body 10 between the flanges 11 in such a manner as to form two parallel rows of contact elements 30 projecting respectively in the recesses 12.

Figure 5:
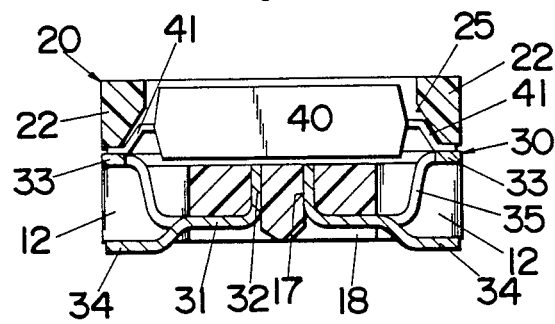
FIG. 5 is a sectional view of the above socket.

The cover frame 20 is a rectangular member comprising a pair of opposed end bars 21 connected by side bars 22 and is placed over the socket body 10 to press the IC package leads 41 against the corresponding contact elements 30 so as to effect positive electrical connection therebetween and to hold the IC chip package 40 in place by the pressing engagement of the leads 41 with the contact elements 30, as shown in FIG. 5. As seen in the figure, the IC chip package 40 is supported on the socket body 10 while leaving a clearance therebetween. Upstanding from the lateral centers of the opposite flanges 11 are catches 13 which are formed with inward latches 14 for snap engagement respectively with stops 23 formed at the lateral centers of the opposed end bars 21 of the cover frame 20 for detachably connecting the cover frame 20 on the socket body 10. Each stop 23 is recessed in the end bar 21 and formed at its lower outer end With a bevelled surface 24 which comes into contact with a like bevelled surface 15 at the upper inner end of the catch 13 as the cover frame 20 is placed down on the socket body 10, thereby flexing the catch 13 outwardly enough to guide the stop 23 past the latch 14, after which the catch 13 returns inwardly to effect the snap engagement between the latch 14 and the stop 23. Each of the flanges 11 is formed with a pair of laterally spaced upright ribs 16 which are engaged with the inner bottom periphery of the cover frame 20 at the corresponding corners thereof for exact positioning of the frame 20 on the socket body 10 in relation to the IC chip package 40. As shown in FIG. 5, the side bars 22 of the cover frame 20 are each formed at its inner lower end with an inclined edge 25 which conforms to curved portions of the leads 41 so that it may assist pressing the leads 41 against the contact elements 30 for firm holding of the leads 41 between the side bar 22 and the contact elements 30.

Figure 6:
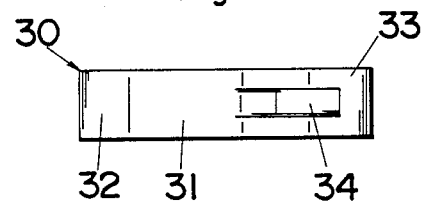
FIG. 6 is a top view of a contact element utilized in the above socket.
Figure 7:
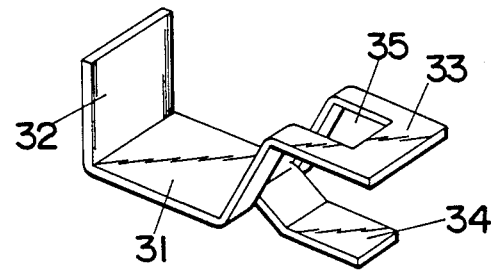
FIG. 7 is a perspective view of the contact element.

As shown in FIGS. 6 and 7, each contact element 30 is stamped and bent from a single elongated strip of electrically conductive material to comprise a flat base 31 and an anchor leg 32 bent upward at a right angle from one end of the base 31. The other end of the base 31 is bent upward and then bent horizontally to define a spring leg 33 which is a member for pressed contact with the IC package lead 41. Also extending from the other end of the base 31 is a terminal leg 34 which is somewhat bent downward and then horizontally in vertically spaced relation with the spring leg 33 for soldering connection on the circuit of the printed board. As shown in the figures, the terminal leg 34 is struck from the spring leg 33 to leave an elongated aperture 35 dividing the spring legs 33 into two spaced sections which are bridged together at the distal ends. The terminal leg 34 terminates at a point vertically aligned with the distal end of the spring leg 33 and can be exposed upwardly through the aperture 35 such that, when mounting the terminal leg 34 on the printed board by reflow soldering, an infrared radiation can be directed through the aperture 35 toward the terminal leg 34 from above the socket body 10 for enabling the reflow soldering by the infrared radiation.

The contact elements thus formed are assembled to the socket body 10 by press-fitting the anchor legs 32 into slots 17 formed in the lateral center of the socket body 10, as seen in FIG. 5, so that the spring legs 33 project laterally outwardly of the socket body 10 and slightly upwardly of the upper end thereof and the terminal legs 34 also project laterally outwardly and slightly downwardly of the bottom of the socket body 10. The slots 17 are open to depressions 18 respectively formed in the bottom of the socket body 10 and arranged along the length thereof so that the anchor leg 32 can be inserted into the corresponding slots 17 from below the socket body 10 with the base 31 of each contact element 30 lying against the upper bottom of the depression 18. With this structure of providing the anchor leg 32 and the spring leg 33 at the opposite ends of the base 31, the spring leg 33 can be substantially free from a force which is applied to the anchor leg 32 for insertion thereof in the slot 17, thereby being prevented from undesirable stressing beyond elastic limit and therefore assured of consistent spring characteristic for reliable electrical contact with the IC package lead 41. The spring leg 33 and the terminal leg 34 are vertically spaced to define therebetween an open space enough to be readily available without being interfered with the socket body 10 for soldering the terminal leg 34 on the printed board. It is noted at this time, as shown in FIG. 5, that the spring legs 33 and the terminal legs 34 are within the width dimension of the socket body 10 or the flanges 11 and that the cover frame 20 has no substantial portion extending laterally beyond the contact elements 30, the width of the entire socket can be reduced to as less as the width dimension of the IC package 40.

Figure 8:
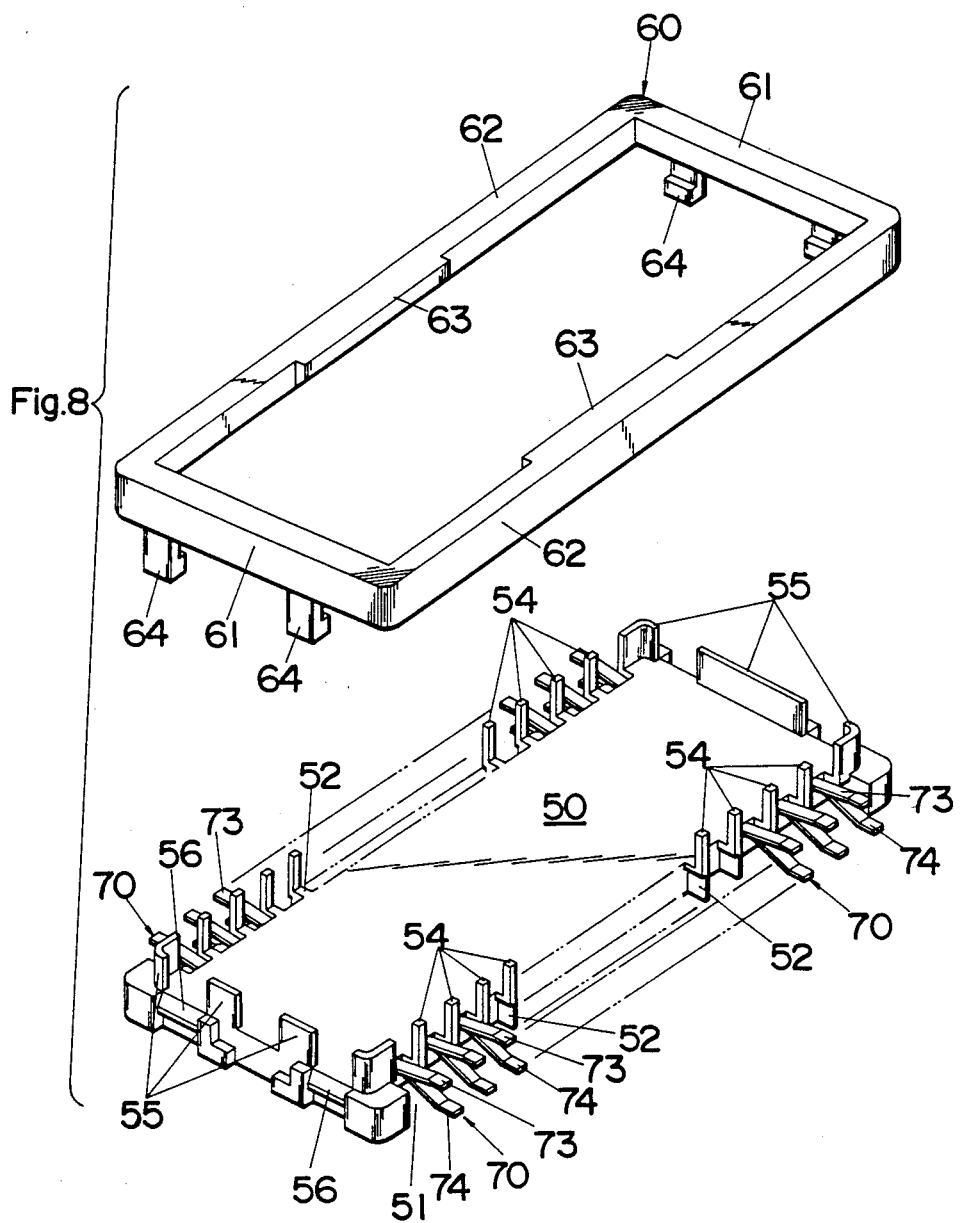
FIG. 8 is an exploded perspective view of a socket in accordance with another embodiment of the present invention.
Figure 9:
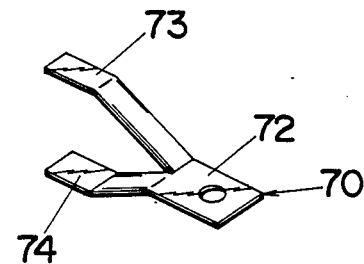
FIG. 9 is a perspective view of a contact element utilized in the socket of FIG. 8.
Figure 10:
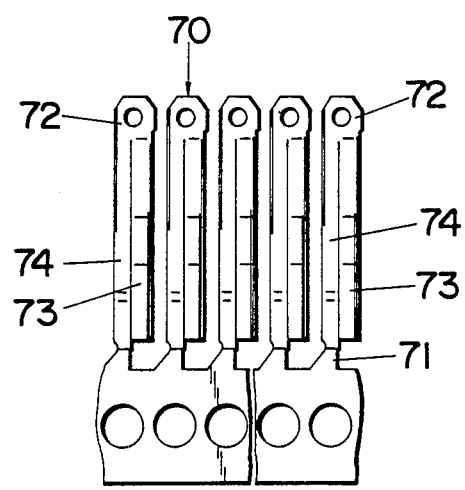
FIG. 10 is a plane view of the contact elements of FIG. 9 prior to being separated from a blank sheet.

Second embodiment <FIGS. 8 to 10>

FIG. 8 shows a socket in accordance with a second embodiment of the present invention which is similar in structure to the above first embodiment. The socket comprises a generally rectangular socket body 50 of electrically insulating material and a rectangular cover frame 60 of like insulating material. The socket body 50 is provided in its opposite sides respectively with longitudinally aligned slots 51 which are separated by comb-teeth members 52 respectively for receiving individual contact elements 70. The contact elements 70 are blanked from a metal sheet of conductive material and are separated therefrom at connections 71, as shown in FIG. 10, to form an upward bent spring leg 73 and a downward bent terminal leg 74 both extending from an anchor end 72. That is, the lengthwise portion of the contact element 70 except for the anchor end 72 is bifurcated to provide the spring leg 73 and the terminal leg 74 which are vertically spaced in the like manner as in the first embodiment and laterally offset, as shown in FIG. 9. The contact elements 70 thus formed are supported to the socket body 50 with the anchor end 72 embedded or inserted deep in the respective slots 51 so that the spring legs 73 project laterally outwardly and slightly upwardly of the socket body 50 and the terminal legs 74 project laterally outwardly and slightly downwardly of the socket base 50. Due to the offset arrangement structure of the spring leg 73 and the terminal leg 74 of each contact element 70, they are arranged along the sides of the socket body 50 in staggered relation so that the terminal legs 74 can be exposed upwardly without being interfered by the spring legs 73, enabling to direct the infrared radiation from the above to the terminal legs 74 for reflow soldering of the terminal legs 74 on the printed board equally as in the first embodiment.

Projecting on the upper surface of the socket body 70 are grid posts 54 formed along the lateral edge over a limited region in alignment with the comb-teeth members 52 such that the IC package leads are exactly positioned between the adjacent grid posts 54 for exact placement of the leads on the spring legs 73. The posts 54 are also cooperative with end walls 55 upstanding on the longitudinal ends of the socket body 50 to define an inside rim around which the cover frame 60 is positioned. The cover frame 60 is formed on the inner periphery of the opposite side bars 62 respectively with elongated protrusions 63 which are received into center breaks each formed between the far spaced grid posts 54 for exact positioning of the cover frame 60 with respect to the lengthwise direction on the socket body 50. The cover frame 60 is detachably locked on the socket body 50 to press the IC package leads against the spring legs 73 of the contact elements 70 in the like manner as in the first embodiment for positive electrical connection therebetween. Depending from the opposed end bars 61 of the cover frame 60 are hooks 64 for snap engagement respectively with corresponding catch projections 56 at the longitudinal ends of the socket body 50. It is noted at this time the contact element 70 can be modified to have a anchor leg bent upward for insertion into correspondingly formed slot in the socket body in the like manner as in the first embodiment. In such case, the contact element is preferred to have a horizontally extending base from one end of which the anchor leg is bent upwardly and from the other end of which the spring and terminal legs are bent upwardly and downwardly, respectively.

What is claimed is:

1. A socket adapted for mounting on a printed circuit board an IC chip package having a plurality of sideward extending leads comprising:

an elongated socket body of electrically insulating material;

a plurality of contact elements carried by said socket body to be aligned along the length thereof;

a cover frame of electrically insulating material fitted on said socket body in order to press said IC chip leads against the corresponding ones of said contact elements for positive electrical connection therebetween;

each of said contact elements comprising a base and an anchor leg at one end of said base, the other end of said base extending laterally and being bifurcated to form a vertically spaced pair of a spring leg for contact with the corresponding one of said IC chip leads and a terminal leg for connection with a circuit on said printed board, said contact elements fixed to said socket body with said anchor leg fixed to the lateral center portion of said socket body in such a way as to project said spring leg and terminal legs laterally outwardly of said socket body and to form an open space between said spring and terminal legs; and said socket body provided at its longitudinal ends with catch means for detachably engagement with the corresponding ends of said cover frame for supporting said cover frame in position on said socket body.

2. A socket as set forth in claim 1, wherein said contact element is stamped from a metal strip and bent to form said anchor, spring, and terminal legs.

3. A socket as set forth in claim 1, wherein said contact elements are arranged in a row along the length of the socket body with the spring and terminal legs staggered with respect to the lengthwise direction of said socket body.

4. A socket as set forth in claim 3, wherein said contact elements is formed from a strip of which half sections are bent upward and downward respectively to define said spring and terminal legs by the two offset half sections.

5. A socket adapted for mounting on a printed circuit board an IC chip package having a plurality of sideward extending leads comprising:

a socket body of electrically insulating material;

a plurality of electrical contact elements supported by said socket body;

a cover frame of electrically insulating material fitted on said socket body in order to press said IC chip leads against the corresponding ones of said contact elements for positive electric connection therebetween;

each of said contact elements comprising a base and an anchor leg extending from one end of said base to be bent into said socket body, the other end of said base extending laterally and being bifurcated to form a vertically spaced pair of a spring leg for contact with the corresponding one of said IC chip leads and a terminal leg for connection with a circuit on said printed board;

said socket body formed in its center portion with a plurality of slots which open to a bottom surface of said socket body and into each of which said anchor leg is press-fitted such that said spring leg and said terminal leg project generally laterally of said socket body in vertical spaced relation forming an open space between said spring and terminal legs; and said socket body provided at its longitudinal ends with catch means for detachably engagement with the corresponding ends of said cover frame for supporting said cover frame in position on said socket body.

6. A socket as set forth in claim 5, wherein said socket body is an elongated member provided at its longitudinal ends with laterally extending and longitudinally opposed flanges which define therebetween recesses laterally outwardly of said socket body for receiving said contact elements therein, said spring and terminal legs extending laterally and terminating at a point within the lateral end of said flange.

7. A socket as set forth in claim 5, wherein said contact elements are arranged in a row along the length of the socket body with the spring and terminal legs staggered with respect to the lengthwise direction of said socket body.

8. A socket as set forth in claim 7, wherein each of said terminal legs is struck from the corresponding spring leg to form therein an aperture which divides the spring legs on the opposite sides of the aperture and through which the terminal leg is open upwardly so that the spring leg and the terminal legs are staggered in the lengthwise direction of the socket body.

9. A socket adapted for mounting on a printed circuit board an IC chip package having a plurality of sideward extending leads comprising:

an elongated socket body of electrically insulating material;

a plurality of contact elements carried by said socket body to be aligned along the length thereof;

a cover frame of electrically insulating material fitted on said socket body in order to press said IC chip leads against the corresponding ones of said contact elements for positive electrical connection therebetween;

each of said contact elements comprising a base and an anchor leg at one end of said base, the other end of said base extending laterally and being bifurcated to form a vertically spaced pair of a spring leg for contact with the corresponding one of said IC chip leads and a terminal leg for connection with a circuit on said printed board, said contact elements fixed to said socket body with said anchor leg fixed to the lateral center portion of said socket body in such a way as to project said spring leg and terminal legs laterally outwardly of said socket body and to form an open space between said spring and terminal legs.

* * * * *